(12) United States Patent
Sato

(10) Patent No.: US 6,780,026 B2
(45) Date of Patent: Aug. 24, 2004

(54) ELECTRICAL JUNCTION BOX

(75) Inventor: Kumiko Sato, Shizuoka (JP)

(73) Assignee: Yazaki Corporation, Tokyo (JP)

( * ) Notice: Subject to any disclaimer, the term of this patent is extended or adjusted under 35 U.S.C. 154(b) by 196 days.

(21) Appl. No.: 09/987,584

(22) Filed: Nov. 15, 2001

(65) Prior Publication Data

US 2002/0061666 A1 May 23, 2002

(30) Foreign Application Priority Data

Nov. 17, 2000 (JP) ........................................ 2000-351825

(51) Int. Cl.$^7$ ............................................ H01R 12/00
(52) U.S. Cl. ...................................................... 439/76.2
(58) Field of Search ................................ 439/76.1, 949, 439/76.2, 74, 395–400, 404–409, 736, 752

(56) References Cited

U.S. PATENT DOCUMENTS 6,215,101 B1 * 4/2001 Kondo et al.

FOREIGN PATENT DOCUMENTS

DE 100 62 196 A1 * 7/2001

* cited by examiner

Primary Examiner—J. F. Duverne
(74) Attorney, Agent, or Firm—Armstrong, Kratz, Quintos, Hanson & Brooks, LLP

(57) ABSTRACT

The electrical junction box X includes an upper cover 1, a distributing board 4 fitted with a busbar 5, a wiring sheet 6, and the lower cover 10. The lower cover 10 is formed with a through-hole 8a which is inserted by a terminal 5' of the busbar 5. The wiring sheet 6 is provided with a through-hole 7a through which the terminal 5' of the busbar 5 is inserted. This allows a smaller assembling tolerance between the terminal 5' of the busbar 5 and the through-hole 8a in combination of the wiring sheet 6b attached to the distributing board 4 with the lower cover 10.

10 Claims, 11 Drawing Sheets

ELECTRICAL JUNCTION BOX

BACKGROUND OF THE INVENTION

1. Field of the Invention

The present invention relates to an electrical junction box such as a junction box and a relay box which are used for electrical wiring, for example, of an automotive vehicle. The present invention relates particularly to an electrical junction box having a construction which allows an easy combining work of a lower cover, a wiring sheet, etc. thereof.

2. Related Art

Referring to FIG. 9, a conventional junction box X or a conventional electrical junction box such as a relay box and components including a distributing board 4 of the box will be briefly discussed hereinafter.

FIG. 9 is an exploded perspective view of the conventional electrical junction box X which comprises an upper cover 1, a distributing board 4, a wiring sheet 6, routing conductors 9 and a lower cover 10. The electrical junction box X has a junction box main body consisting of the upper cover 1 and the lower cover 10 which are made of a synthetic resin material. The junction box main body accommodates the distributing board 4 consisting of busbars, a circuit board, etc. Terminals constituted by the busbars are disposed in a connector provided on the upper cover. The electrical junction box X shown in FIG. 9 may be called as a busbar assembly including the distributing board 4 and the wiring sheet 6.

The upper cover 1 has a mini fuse accommodation section, a connector housing, etc. and also protects internal components including the distributing board, the busbars, and terminals, for example, female terminals for mini fuses. The upper cover 1 is a main cover. Alternatively, the lower cover may be a main cover in accordance with applications and operational conditions thereof.

The lower cover 10 has a mini fuse accommodation section, a connector housing, etc. and also protects internal components including the distributing board, the busbars, and terminals, for example, female terminals for mini fuses. Generally, the lower cover is combined to the upper cover 1 to define the electrical junction box X. The lower cover 10 is also called as an underside cover.

These female terminals will be discussed herein. The female terminal has each end provided with a receptacle-type connection portion, for example, which is called as a fuse F—F terminal when it connects a busbar with a fuse and as a relay F—F terminal when it connects a busbar with a relay. F—F shows two female-type contacts.

Such junction boxes, junction blocks, or electrical junction boxes X like a relay box include integrated block components defined by combining a plurality of connectors, relays, and fuses into an electrical circuit having electrical wires, busbars, and etc. Generally, such boxes are utilized to divide a wiring harness. The distributing board 4 is an insulating plate which can retain busbars and electrical wires. The busbar is made of a conductivity metal plate and has a lot of electrical contacts to divide an electrical circuit into a plurality of circuits.

As illustrated in FIG. 9, the lower cover 10 has a bottom wall provided with a through-hole portion 8c having an alignment enhancing through-hole 8a. The alignment enhancing through-hole 8a is slightly apart inside from a side wall of the lower cover 10. The distributing board 4 consists of a distributing board 4a disposed on the upper cover 1 and a distributing board 4b disposed in a side of the wiring sheet 6. On an underside of the distributing board 4, there is provided a busbar associated with the alignment enhancing through-hole 8a of the lower cover 10.

The wiring sheet 6 is disposed under the distributing board 4. Under the wiring sheet 6, electrical wires 9 having curved portions such as routing conductors are attached to the wiring sheet 6 at predetermined positions. Next, referring to FIG. 10, a step for inserting the busbar into the alignment enhancing through-hole 8a of the through-hole portion 8c formed in the lower cover 10 will be discussed.

FIG. 10 is an enlarged longitudinal sectional view of the conventional alignment enhancing through-hole 8a and a surrounding part thereof and shows a busbar 5, particularly a terminal portion 5' of a connector busbar 5c. The connector busbar 5c has a tab tip portion 5b allowing an easy insertion of the busbar 5 into the alignment enhancing through-hole 8a.

The lower cover 10 is constituted by a bottom wall 10a and side walls 10b, and the bottom wall 10a is compensated by ribs 10k. The bottom wall 10a is formed with the through-hole portion 8c having the alignment enhancing through-hole 8a.

The alignment enhancing through-hole 8a formed in the lower cover 10 has an upper insertion opening 8f and an intermediate tapered portion 8e for an easy insertion of the connector busbar 5c into the alignment enhancing through-hole 8a. The alignment enhancing through-hole 8a has a lower exit opening 8g for extending the busbar 5 therefrom. Below the alignment enhancing through-hole 8a, that is, under the lower cover 10, there is provided a connector housing 8. The distributing board 4, the wiring sheet 6 having the routing conductors 9, and the lower cover 10, which are illustrated in FIG. 9, are combined with each other, so that the connector busbar 5c shown in FIG. 10 is inserted into the alignment enhancing through-hole 8a to pass through the alignment enhancing through-hole 8a so as to extend toward the connector housing 8. This defines a male connector which is connected to another electrical component such as a wiring harness having a receptacle connector.

FIG. 11 is a bottom view showing a wiring area A and a neighboring area thereof in respect of the conventional wiring sheet 6 of the distributing board. The bottom view is a general illustration of the wiring sheet 6 provided with the routing conductors 9, which is taken upward from the bottom wall of the lower cover 10. The wiring sheet 6 is mounted on the lower cover 10 so as not to interfere with the through-hole portion 8c and the alignment enhancing through-hole 8a of the lower cover 10.

The wiring sheet 6 has a base plate 6a on which a lot of the routing conductors 9 are mounted. The routing conductors 9 are arranged in the wiring area A so as to have adequate curved portions. The routing conductors 9 are electrically connected in a pattern by a predetermined large number of press-fit terminals 15 disposed on an underside surface of the distributing board. Further, the base plate 6a of the wiring sheet 6 is formed with a plurality of positioning holes 6c for accurately combining the wiring sheet 6 with the upper cover 1, the lower cover 10 having the side wall 10b, and the distributing board 4.

Referring to a prior art, Japanese Utility Model No. 3-40048 discloses an electrical junction box used for connection of wiring harnesses. The electrical junction box accommodates a busbar wiring pattern having tab terminals which are accurately vertically extended to achieve an improved connection with an associated connector.

Generally, the busbar terminals attached on the distributing board are not accurately oriented with variations in orientation thereof. Thus, the insertion opening 8f of the alignment enhancing 8a (FIGS. 9 and 10) of the lower cover 10 must have a larger size so that the terminal 5' of the busbar 5 ununiformly attached in the distributing board 4 may be easily insertable into the alignment enhancing through-hole 8a of the lower cover 10 as illustrated in FIG. 10.

However, the alignment enhancing through-hole 8a shown in FIG. 10 must have the tapered portion 8e of a comparatively longer length because of an easy insertion of the terminal 5' of the connector busbar 5c, resulted in a larger size of the through-hole portion 8c. As illustrated in FIG. 10, The through-hole portion 8c including the alignment enhancing through-hole 8a is higher than the side wall 10b above the bottom wall 10a of the lower cover 10.

This is caused by the larger size of the insertion opening 8f of the alignment enhancing through-hole 8a to receive the busbar 5. The elongated tapered portion 8e of the alignment enhancing through-hole 8a allows the larger size of the insertion opening 8f of the alignment enhancing through-hole 8a to receive the busbar 5. Therefore, the required length of the alignment enhancing through-hole 8a causes the through-hole portion 8c to be higher than the other part above the lower cover 10.

The conventional lower cover 10 of such construction is not suitable for size minimization of the electrical junction box X. A molding die for the lower cover 10 tends to be expensive since the molding die may have a larger size so as to form the extended portion of the through-hole portion 8c.

Furthermore, as illustrated in FIG. 11, the conventional wiring sheet 6 provides the wiring area A which is reduced in size. Referring to details, the conventional wiring sheet 6 is defined not to interfere with the through-hole portion 8c and the alignment enhancing through-hole 8a of the lower cover 10. This reduces the wiring sheet 6 in size, so that the wiring sheet 6 having the wiring reduced area A is undesirably used for the electrical junction box X.

As mentioned above, the electrical junction box X needs to keep the necessary wiring area A of the wiring sheet 6 and another area for the through-hole portion 8c and the alignment enhancing through-hole 8a of the lower cover 10. This configuration is not preferable for reduction in size and weight of the electrical junction box X.

SUMMARY OF THE INVENTION

An object of the present invention is to provide an electrical junction box which allows an easy combining work of a distributing board, a wiring sheet, and a lower cover in addition to achieving a smaller assembling tolerance thereof. Another object of the present invention is to provide a larger wiring area of the wiring sheet to arrange routing conductors thereon. Additionally, the present invention aims size minimization of the wiring sheet, the lower cover, and molding dies thereof, which also achieves simplification of the molding dies and smaller material costs of the wiring sheet and the lower cover.

For achieving the objects, an aspect of the invention is an electrical junction box having an upper cover, a distributing board provided with a busbar, a wiring sheet, and a lower cover formed with a through-hole for receiving terminal of the busbar, characterized in that the wiring sheet is formed with a through-hole for receiving the terminal of the busbars whereby the terminal of the busbar is inserted into the through-hole of the lower cover with a smaller assembling tolerance when the lower cover is combined with the wiring sheet which preliminary combined with the distributing board.

This configuration, unlike the above-mentioned conventional electrical junction box, does not need to have a larger insertion opening formed in the lower cover for the busbar terminal with keeping a predetermined insertion distance. Because, the distributing board cab be preliminary combined with the wiring sheet before combined with the lower cover so that an insertion tolerance of the busbar terminal into the through-hole may be smaller. In addition, the through-hole of the lower cover may have a shorter insertion length. This enables a size minimization and a weight reduction of the lower cover and a cost reduction of molding dies for forming the. lower cover.

More specifically speaking, in the conventional, the wiring sheet has no through-hole and only the lower cover has the through-hole. Thus, the through-hole of the lower cover is defined to allow the position variations of the busbar terminal of the distributing board. Since the wiring sheet is disposed between the distributing board and the lower cover, it is necessary to consider a total assembling tolerance of the wiring sheet, the distributing board provided with each busbar, and the lower cover.

The busbar terminals attached to the distributing board are not accurately arranged in the distributing board but have often variations in position thereof. This requires a larger insertion opening of the through-hole of the lower cover to allow an easy insertion of the busbar terminal of the distributing board into the lower cover through-hole regardless of the position variations of the busbar terminal.

However, in order to accurately position the busbar terminal in the through-hole of the lower cover, the through-hole needs to have the tapered portion extending from the insertion opening to the exit opening thereof in addition to the larger insertion opening. The tapered portion causes the through-hole to be progressively smaller in section. Therefore, a smaller assembling tolerance of the busbar terminal increases the length of the through-hole portion.

Meanwhile, in the present invention, the wiring sheet is formed with the through-hole through which the busbar is inserted and the distributing board is combined with the wiring sheet. The combined distributing board having the busbar is combined with the lower cover to define the electrical junction box. Thereby, an assembling tolerance of the busbar in the electrical junction box can be divided into one between the distributing board and the wiring sheet through-hole and another between the wiring sheet through-hole and the lower cover through-hole.

The busbar terminal disposed in the distributing board is corrected in its position due to insertion into the wiring sheet through-hole to reduce position variation of the busbar terminal when the distributing board is combined with the wiring sheet. This reduces the through-hole of the lower cover and its associated construction in size.

Furthermore, such combination of the wiring sheet and the distributing board allows the wiring sheet through-hole to guide the busbar terminal attached to the distributing board, reducing a lateral deviation of the busbar tab. The combined unit of the distributing board and the wiring sheet is easily combined with the lower cover, enabling a speedy and effective assembling work of the electrical junction box.

Preferably, the through-hole formed in the wiring sheet has an insertion opening, an exit opening, and a tapered portion such that the through-hole has a sectional area progressively smaller from the insertion opening to the exit opening, and the exit opening has a width substantially equal to a thickness of the terminal of the busbar.

Such configuration allows the busbar attached to the distributing board to be easily inserted into the through-hole of the wiring sheet and to be inserted into the lower cover through the wiring sheet to define the connector with a smaller assembling tolerance between the busbar and its received portion.

In order to insert an inaccurately positioned busbar of the distributing board into the through-hole of the wiring sheet, the insertion opening of the through-hole shall be increased in width. However, since it is necessary to accurately position the busbar within the through-hole, the size of the exit opening is determined to be approximately equal to the thickness of the busbar terminal. Furthermore, the tapered portion is provided to extend from the insertion opening to the exit opening of the through-hole, so that the busbar terminal passes smoothly the through-hole of the wiring sheet.

Preferably, the through-hole of the lower cover has an extending length substantially equal to a bottom wall thickness of the lower cover.

Such configuration allows minimization of the through-hole and its associated surrounding portion of the lower cover as well as an accurate positioning of the busbar terminal. This reduces the lower cover in size, enabling minimization of molding dies of the lower cover together with a cost reduction of the molding dies.

In this configuration, the wiring sheet is formed with the through-hole so that a smaller assembling tolerance for insertion of the busbar terminal can be provided between the busbar terminal attached to the distributing board and the through-hole of the lower cover. This allows a smaller deviation of the busbar tab when the distributing board combined with the wiring sheet is combined with the lower cover. Additionally, a smaller assembling tolerance between the distributing board combined with the wiring sheet and the lower cover can be provided, allowing minimization of the through-hole and its associated surrounding portion of the lower cover.

Preferably, the electrical junction box has a connector housing positioned under the lower cover, the connector housing associated with the through-hole of the lower cover.

Such configuration of the busbar terminal and the connector housing defines the male connector which can be electrically connected to an associated receptacle connector. Thus, the electrical junction box according to the present invention can be electrically connected to another electrical component with ease.

Preferably, the through-hole of the wiring sheet is positioned in a wiring area of the wiring sheet.

Such configuration allows the wiring sheet to efficiently arrange the routing conductors and the through-hole thereon without any restriction of the base plate of the wiring sheet. Thus, the base plate of the wiring sheet can provide an effective arrangement area, reducing the electrical junction box in size and weight.

DETAILED DESCRIPTION OF PREFERRED EMBODIMENT

Figure 1:
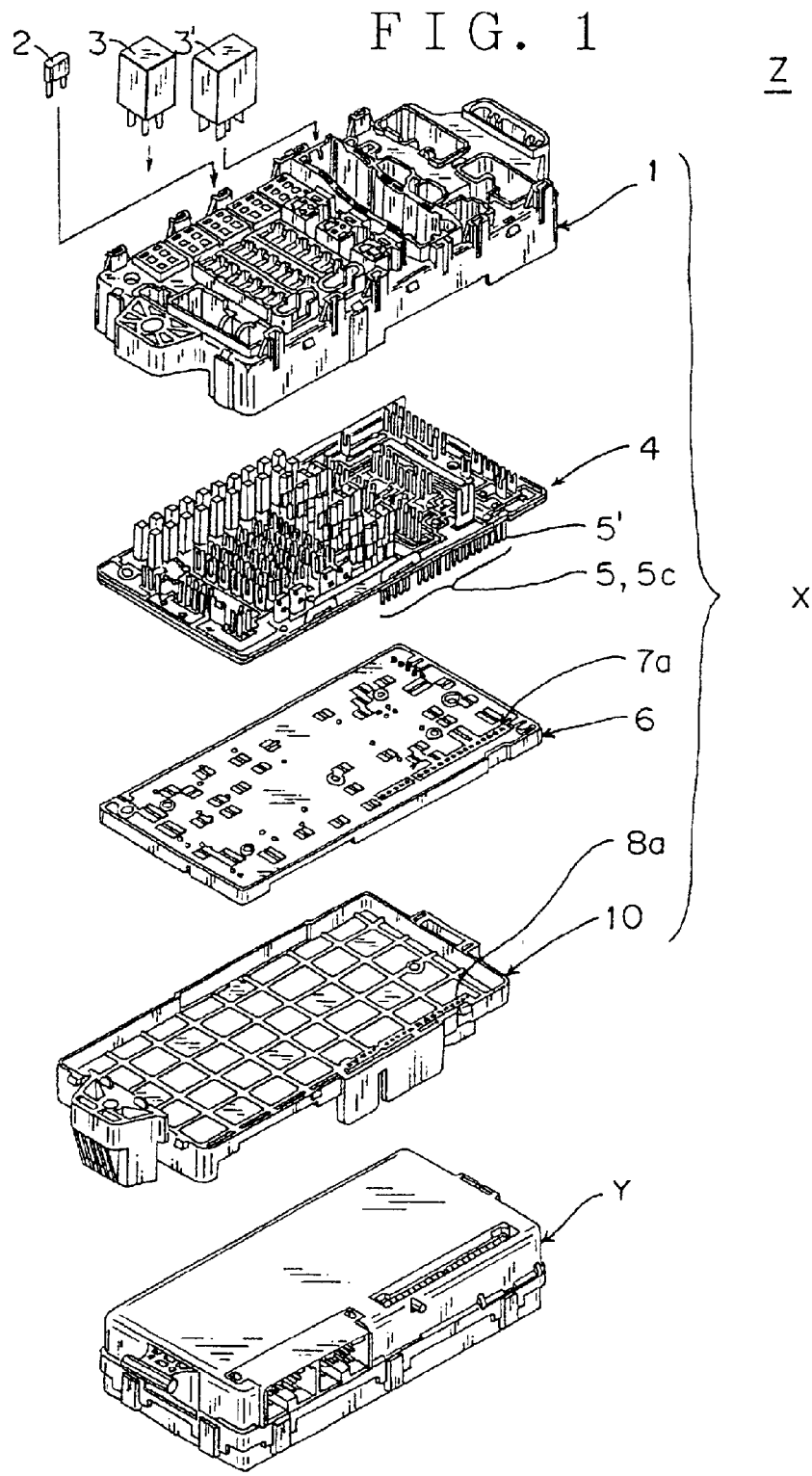
FIG. 1 is an exploded perspective view showing electrical junction boxes according to the present invention.

Referring to FIGS. 1 to 8, an embodiment of the electrical junction box according to the present invention will be discussed. The same components as those of the aforementioned conventional electrical junction box have the same reference numerals as the conventional art and will not be discussed again.

Now, the electrical junction boxes X, Y, and Z will be discussed. The electrical junction box X comprises an upper cover 1, a distributing board 4, a wiring sheet 6, and a lower cover 10. A first box is the electrical junction box X. A second box is the electrical junction box Y which is combined with the first electrical junction box X. The electrical junction box Z is a box defined by combining the first electrical junction box X with the second electrical junction box Y.

Figure 2:
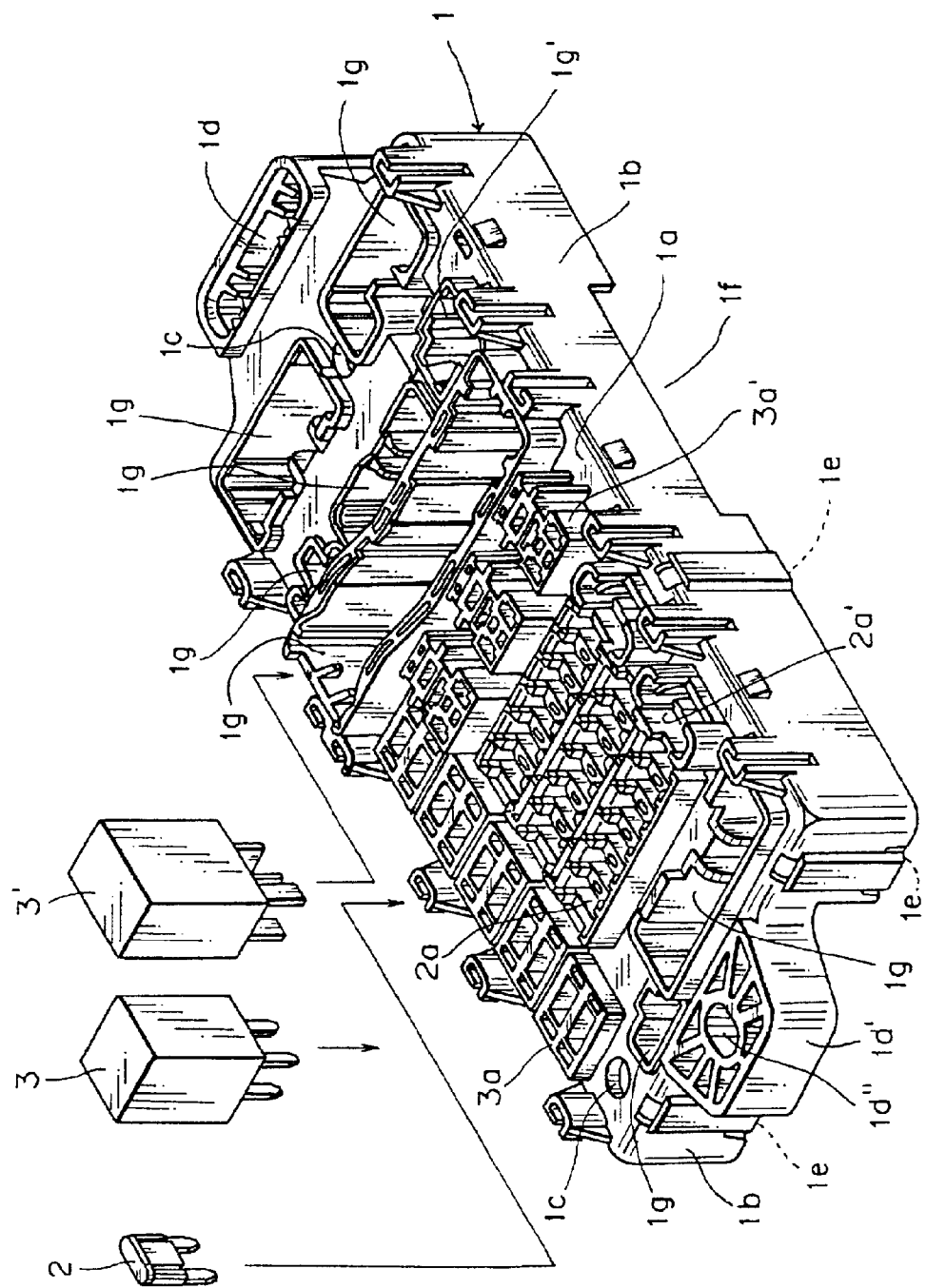
FIG. 2 is an enlarged perspective view showing an upper cover of FIG. 1 and also illustrates a fuse and relays which will be attached to the upper cover.

As illustrated in FIGS. 1 and 2, the upper cover 1 has fuses 2 and relays 3, 3' in an upper side thereof. As illustrated in FIG. 4, the wiring sheet 6 has routing conductors 9 in a lower side thereof. More specifically speaking, FIGS. 1 to 4, FIG. 6, and FIG. 7 show upper sides of the electrical junction boxes X, Y, Z, while opposed sides are lower sides. Front sides of the electrical junction boxes are defined to be, for example, a side where an alignment enhancing through-hole 7a of the wiring sheet 6 is arranged in FIG. 4. An opposed side of the front side is defined as a rear side. Herein, the through-holes 7a, 8a are called as alignment enhancing through-holes 7a, 8a.

In this discussion, a connector is an electrical connection component having a connector housing which includes an electrical connection portion having a terminal and an electrical wire. The connector also has another terminal, a packing, a rubber seat, a rear holder, etc. for electrical connection thereof. Generally, a connector having a male terminal is called as a male connector, while a connector having a female terminal is called as a female connector. In this discussion, an electrical component having at least a terminal and a connector housing is called as a connector. The routing conductors of the present invention represent conductors including insulation protected conductors and cores having a plurality of bundled conductors. The wiring sheet may be called as a routing conductor plate.

FIG. 1 is an exploded perspective view an electrical junction box Z defined by combining the first electrical junction box X with the second electrical junction box Y according to the present invention. The electrical junction box X is defined by combining the upper cover 1, the distributing board 4, the wiring sheet 6, and the lower cover 10. The upper cover 1 of the electrical junction box X has the fuse 2, the relays 3, 3', etc. at predetermined positions thereof.

The distributing board 4 is defined by combining a distributing board 4a facing the upper cover 1 with a distributing board 4b facing the wiring sheet 6. On a lower side of the distributing board 4, there are provided terminals 5' of busbars 5 of connector busbars 5c so as to extend downward. The lower cover 10 has a bottom wall formed with an alignment enhancing through-hole 8a to pass the terminal 5' of the busbar 5 therethrough. Also, the wiring sheet 6 has a base plate formed with an alignment enhancing through-hole 7a to pass the terminal 5' of the busbar 5.

Thus, when the wiring sheet 6 combined with the distributing board 4 is combined with the lower cover 10, the terminal 5' of the busbar 5 is inserted into the alignment enhancing through-hole 8a with a smaller assembling tolerance.

Figure 9:
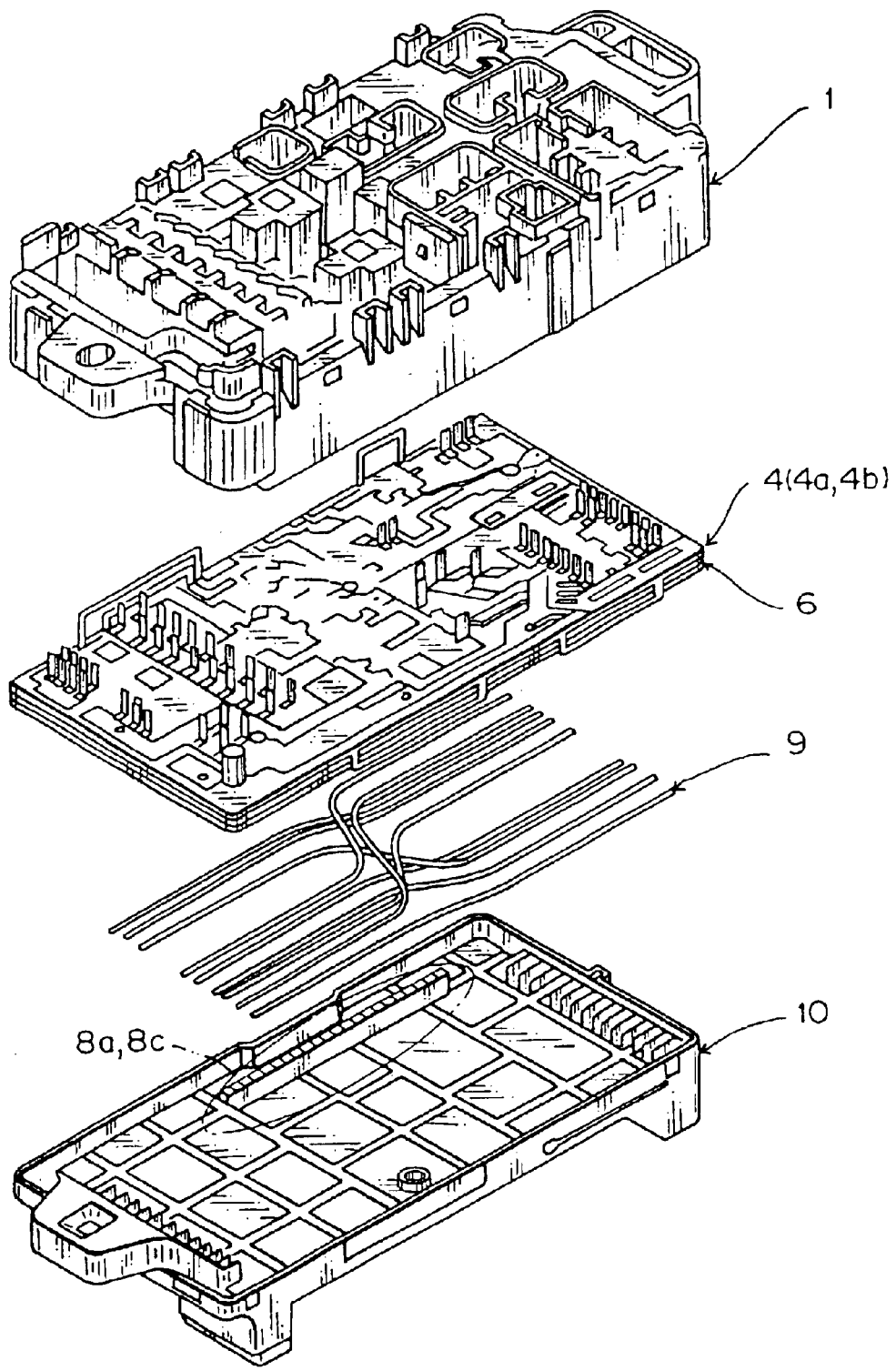
FIG. 9 is an exploded perspective view showing a conventional electrical junction box.
Figure 10:
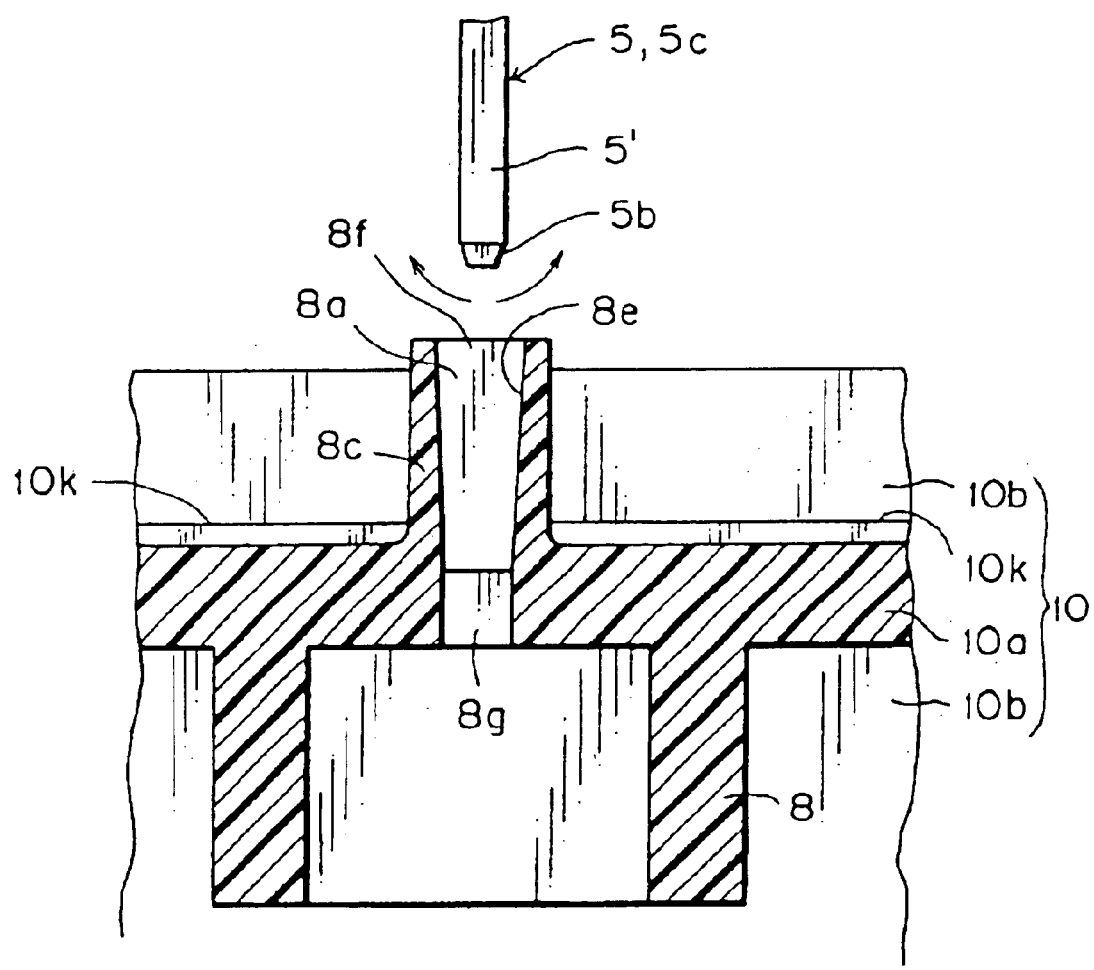
FIG. 10 is a longitudinal sectional view showing a conventional through-hole and its associated surrounding portion.

This configuration, unlike the above-mentioned conventional electrical junction box X shown in FIGS. 9, 10, does not need to have a larger insertion opening 8f of the alignment enhancing through-hole 8a formed in the lower cover 10 for the terminal 5' of the busbar 5 of the connector busbar 5c with keeping a predetermined insertion distance. Because, the distributing board can be preliminary combined with the wiring sheet before combined with the lower cover, so that an insertion tolerance of the busbar terminal 5' into the through-hole 8 may be smaller. This enables a size minimization and a weight reduction of the lower cover 10 and a cost reduction of molding dies for forming the lower cover 10.

More specifically speaking, in the conventional art, the wiring sheet 6 has no alignment enhancing through-hole and only the lower cover 10 has the alignment enhancing through-hole 8a. Thus, the alignment enhancing through-hole 8a of the lower cover 10 is defined to allow the position variations of the terminal 5' of the busbar 5 of the distributing board 4. Since the wiring sheet 6 is disposed between the distributing board 4 and the lower cover 10, it is necessary to consider a total assembling tolerance of the wiring sheet 6, the distributing board 4 provided with each busbar 5, and the lower cover 10.

The terminals 5' of the busbars 5 are attached inaccurately to the distributing board 4 with positioning variations thereof. As illustrated in FIG. 10, the lower cover 10 has the larger insertion opening 8f of the alignment enhancing through-hole 8a so that the inaccurately positioned terminals 5' of the busbars 5 arranged in the distributing board 4 are easily insertable into-the alignment enhancing through-holes 8a of the lower cover 10. The busbar 5 has a busbar tab 5b so that the terminal 5' of the busbar 5 is smoothly insertable into the alignment enhancing through-hole 8a of the lower cover 10.

However, the larger insertion opening 8f of the alignment enhancing through-hole 8a can not accurately position the terminal 5' of the busbar 5 within the alignment enhancing through-hole 8a of the lower cover 10. Therefore, the alignment enhancing through-hole 8a is formed with the tapered portion 8e to extend from the insertion opening 8f to the exit opening 8g thereof. Thereby, the alignment enhancing through-hole 8a has a sectional area progressively smaller from the insertion opening 8f to the exit opening 8g, so that the terminal 5' of the busbar 5 is accurately positioned. Thus, smaller assembling tolerance for the terminal 5 of the busbar 5 results in a larger length of the through-hole portion 8c.

Figure 4:
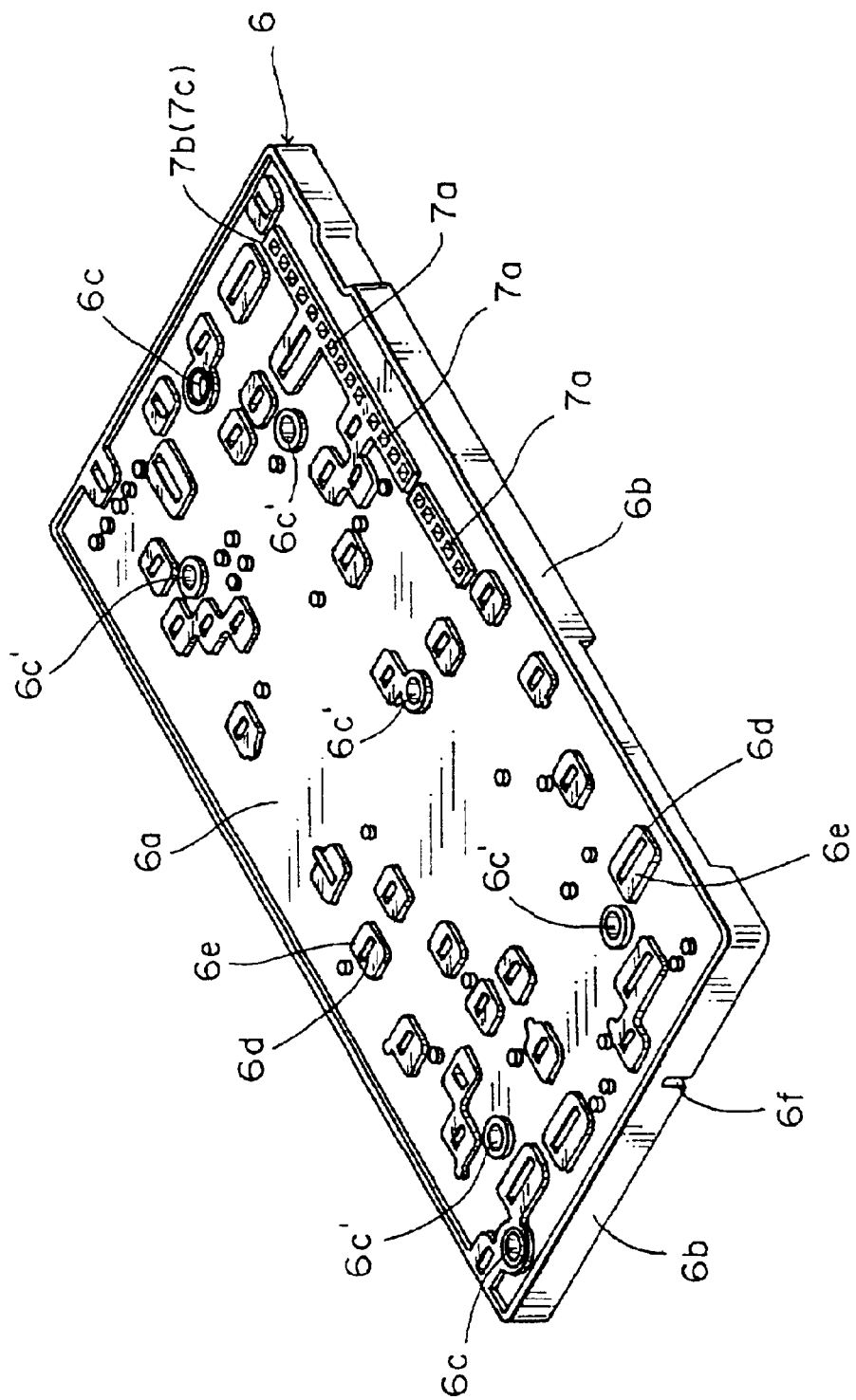
FIG. 4 is an enlarged perspective view showing an upper side of a wiring sheet of FIG. 1.
Figure 5:
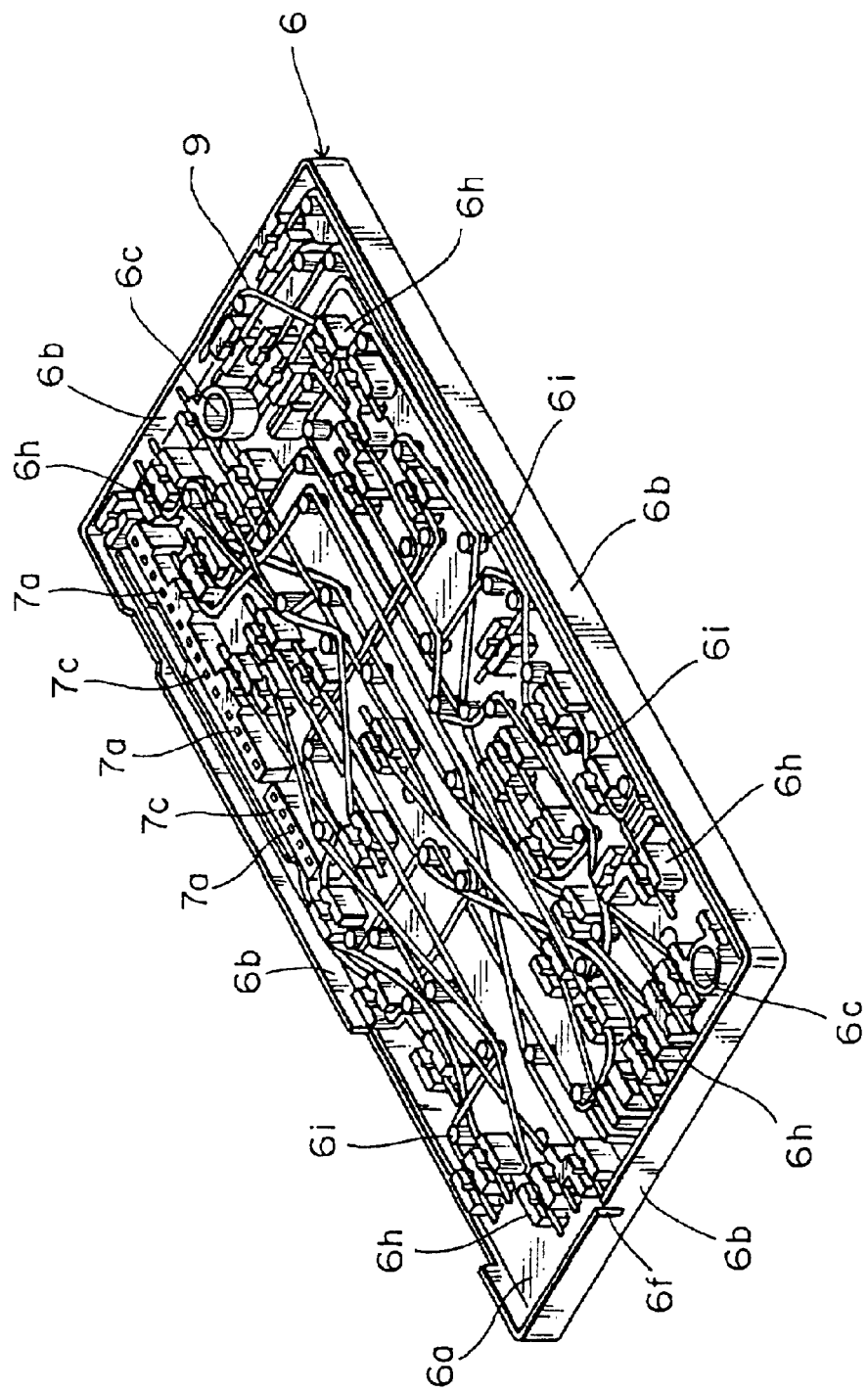
FIG. 5 is an enlarged perspective view showing a rear side of the wiring sheet of FIGS. 1, 4 and routing conductors disposed on the sheet.
Figure 8:
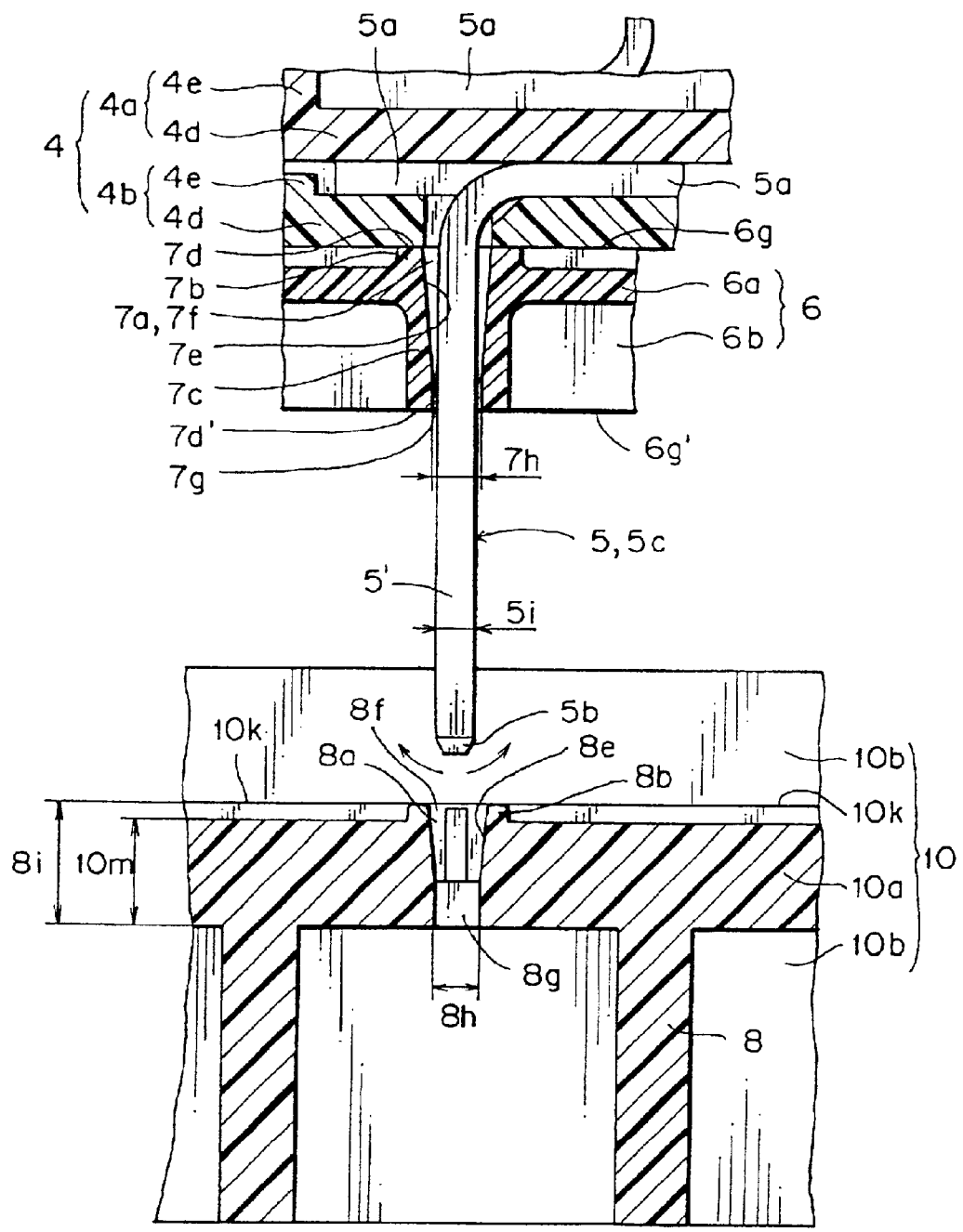
FIG. 8 is a longitudinal sectional view showing a state in which a busbar attached to the distributing board is inserted into a through-hole formed in the wiring sheet before the busbar is inserted into a through-hole of the lower cover.

On the contrary, in the embodiment illustrated in FIGS. 1, 4, and 5, the wiring sheet 6 is formed with the alignment enhancing through-hole 7a as illustrated in FIG. 8. The alignment enhancing through-hole 7a of the wiring sheet 6 receives the busbar 5, and the electrical junction box X is defined by combining the distributing board 4, the wiring sheet 6, and the lower cover 10 as illustrated in FIG. 1. An assembling tolerance of the busbar 5 related to the distributing board 4, the wiring sheet 6, and the lower cover 10 is shared by the alignment enhancing through-hole 7a of the wiring sheet 6 and the alignment enhancing through-hole 8a of the lower cover 10.

As illustrated in FIG. 8, the terminal 5' of the busbar of the distributing board 4 passes through the alignment enhancing through-hole 7a of the wiring sheet 6, thereby correcting the orientation of the terminal 5'. Such combination of the distributing board 4 and the wiring sheet 6 allows the terminal 5' of the busbar 5 to be inserted into the alignment enhancing through-hole 8a of the lower cover 10 with a smaller position variation of the terminal 5' of the busbar 5 Thus, the alignment enhancing through-hole 8a of the lower cover 10 does not need to have its associated surrounding portion of a larger size.

Furthermore, such combination of the wiring sheet 6 and the distributing board 4 allows the terminal 5' of the busbar attached to the distributing board 4 to be guided by the alignment enhancing through-hole 7a of the wiring sheet 6. Thereby, an undesirable lateral off set of the busbar tab 5b is small. The distributing board 4 holding the busbar 5 is combined with the wiring sheet 6 to define a unit. The unit is easily combined with the lower cover 10, enabling a speedy, effective assembling work of the electrical junction box X.

FIG. 2 is an enlarged perspective view showing the upper cover 1 of FIG. 1, the fuses 2, the relays 3, 3', etc. The fuses and relays are mounted in the upper cover 1. The upper cover 1 has a top wall 1a and a side wall 1b surrounding the top wall 1a. The top wall 1a is mounted with various types of connector housings 1g, 1g', fuse fitting portions 2a, 2a', relay fitting portions 3a, 3a', and etc.

On the side wall 1b, there is provided a fitting portion 1d at one side thereof and another fitting portion 1d' at an opposed side thereof. The fitting portion 1d' is provided with a fitting hole 1d". To combine the upper cover 1 with the lower cover 1 shown in FIG. 1, a plurality of lockingprotrusions 10e are provided each at an upper portion of a side wall 10b of the lower cover 10 shown in FIG. 6. Meanwhile, there are provided a plurality of engagement portions Le associated with the locking protrusions 10e and positioned on the side wall 1b of the upper cover 1 shown in FIG. 2.

The upper cover 1 of FIG. 2 is provided with a positioning hole 1c at two points of the top wall 1a thereof for accurate combination of the upper cover 1, the distributing board 4 consisting of the distributing boards 4a, 4b, the wiring sheet 6, and the lower cover 1 of FIG. 1. The insertion of a jig such as a precisely formed rod into the positioning hole 1c aligns the upper cover 1, the distributing board 4, the wiring sheet 6, and the lower cover 10 of FIG. 1 with each other, allowing an accurate, quick combination thereof.

Further, to accurately combine the upper cover 1 with the lower cover 10, the side wall 1b of the upper cover 1 of FIG.

Figure 6:
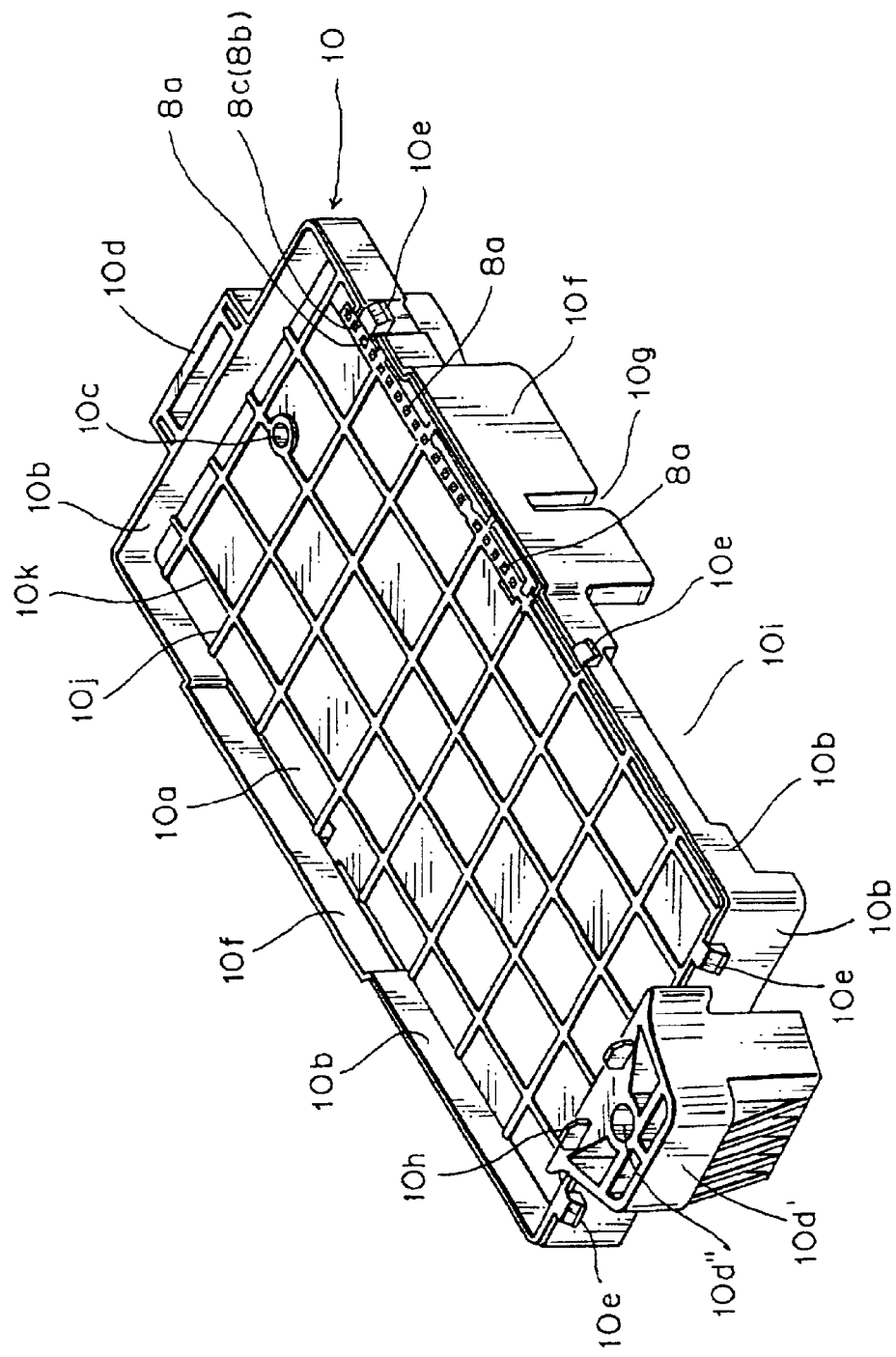
FIG. 6 is an enlarged perspective view showing a lower cover of FIG. 1.

2 is formed with a positioning recess 1*f* corresponding to a positioning extended piece 10*f* formed on the lower cover 10 of FIG. 6.

The top wall 1*a* of the upper cover 1 of FIG. 2 is formed with connector housings 1*g*, 1*g*' having different shapes for receiving different type of connectors. For example, a power supply connector housing 1*g*' receives a power supply socket. In view of an environment protection recycle process, a material identification of the upper cover 1 is imprinted on an upper surface thereof during an injection molding step.

As illustrated in FIG. 2, the fuse fitting portions 2*a*, 2*a*' formed on the top wall 1*a* of the upper cover 1 receives circuit protecting components such as the fuses 2. Further, the relay fitting portions 3*a*, 3*a*' receive the relays 3, 3'. Thereby, electrical components including the fuses 2 and the relays 3, 3' are mounted on the upper surface of the upper cover 1 at desired positions thereof.

The fuse will be briefly discussed herein. The fuse is a circuit protecting component which is disposed in a wiring circuit. The fuse is quickly blown to prevent a damage of an associated electrical component against an overcurrent in the circuit. The fuse is generally used in a large current circuit. The fuses include a large current fuse (20A to 120A) and a blade-shaped fuse (less than 30A). The fuse having a capacity of 30A to 40A may be called as a medium current fuse. Such a medium current fuse is a fusible link which is smaller than a conventional large current fuse.

Figure 3:
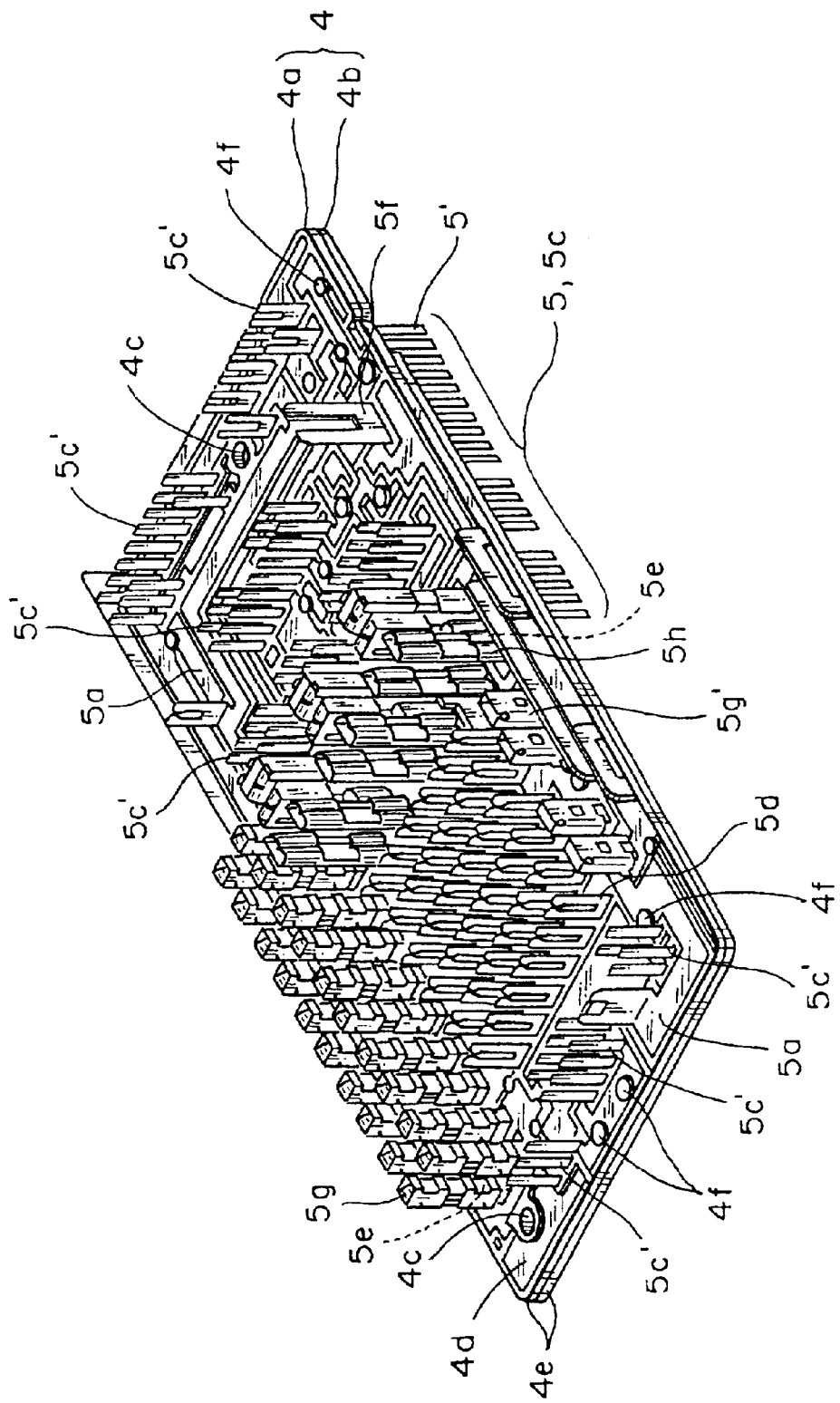
FIG. 3 is an enlarged perspective view showing a distributing board of FIG. 1 and various components mounted on the distributing board.

FIG. 3 is an enlarged perspective view showing the distributing board 4 of FIG. 1 and various types of electrical components disposed on the board. The distributing board 4 of FIG. 3 is defined by overlapping a distributing board 4*a* facing the upper cover over a distributing board 4*b* facing the wiring sheet.

Each distributing board 4*a* or 4*b* is constituted by a base plate 4*d* and an outer peripheral rib 4*e* surrounding the base plate 4*d*. As illustrated in FIG. 3, the base plate 4*d* of the distributing board 4 is provided with various types of busbars 5*c*, 5*c*', 5*d*, 5*e*, and 5*f* on upper and lower surfaces thereof. Many busbars are disposed, so that the distributing board 4 may be called as be a busbar assembly.

On an upper or lower surface of the distributing board 4*a* or on an upper or lower surface of the distributing board 4*b*, there are provided connector busbars 5*c*, 5*c*', fuse busbars 5*d*, relay busbars 5*e*, power supply busbars 5*f*, and etc. These busbars 5*c*, 5*c*', 5*d*, 5*e*, and 5*f* mounted on the base plate 4*d* of the distributing board 4 are defined by turning the busbar base 5*a* electrically connected to other electrical components to function as terminals.

The fuse busbar 5*d* is called as a pinching terminal or a turning fork type terminal from the shape thereof. Another type of the busbars mentioned above each are fitted with a junction terminal 5*g*, 5*g*' if desired. In FIG. 3, each of junction terminals 5*g*, 5*g*', and 5*h* including a relay F—F (two female contacts) terminal 5*h* is connected to a specified busbar.

On the distributing board 4*b* facing the wiring sheet, press-fit terminals extend from busbars or busbar bases to electrically connect to electrical wires including routing conductors.

The press-fit terminal will be briefly discussed herein. The press-fit terminal has a pair of press-fit blades each formed with a tapered portion opposed to each other. The pair of press-fit blades configure the press-fit terminal. The press-fit blades have the pair of tapered portions at an entrance for inserting an electrical wire such as the routing conductor, and the tapered portion has a sharp cutting edge.

The press-fit terminal has a press-fit slit at a central portion thereof for receiving a conductive portion of the routing conductor. The press-fit slit has a width smaller than the diameter of the routing conductor, but the press-fit slit gives neither undesirable damage nor cutting-off of the conductive portion of the routing conductor. The press-fit slit is defined in a U-shape. The press-fit terminal generally has a construction described above but may be of another type in the present invention.

Such press-fit terminals are used for easy, quick, electrical connection of electrical wires consisting of conductors protected by a covering insulation such as a resin material, a rubber, a compound material thereof, or an enamel coating. The press-fit terminal is connected to the electrical wire such as the routing conductor consisting of a conductor protected by such a covering insulation. The press-fitting cuts the covering insulation of the electrical wire such as the routing conductor simultaneously with electrical connection of the inside conductor of the electrical wire.

As illustrated in FIG. 3, from the distributing board 4, a group of terminals 5' of a plurality of connector busbars 5*c* extend downward from the distributing board 4*b* toward the wiring sheet. The group of terminals 5' are inserted into the alignment enhancing through-holes 7*a* formed in the base plate 6*a* of the wiring sheet 6 shown in FIG. 4 and FIG. 5. Then, the terminals 5' pass through the alignment enhancing through-holes 8*a* formed in the bottom wall 10*a* of the lower cover 10 shown in FIG. 6. Finally, the terminals 5' can be electrically connected to female terminals 13*a* in receptacle connectors 13 disposed on a top wall 11*a* of an upper cover 11 constituting the second electrical junction box Y shown in FIG. 7.

For accurate combination of the distributing board 4, the wiring sheet 6, the lower cover 10, and the upper cover 1 of FIG. 1, there is provided a positioning hole 4*c* at two points of the base plate 4*d* of the distributing board 4*a* and a base plate of the distributing board 4*b*. The positioning hole 4*c* is inserted by a jig such as a precisely formed rod into the positioning hole 1*a* to align the upper cover 1, the distributing board 4, the wiring sheet 6, and the lower cover 10 of FIG. 1 with each other, allowing an accurate, quick combining thereof.

As illustrated in FIG. 3, the distributing board 4*a* facing the upper cover lies over the distributing board 4*b* facing the wiring sheet and is secured to each other by a plurality of fixing portions 4*f*. Preferably, there is provided a water drain discharging construction for the distributing board 4 so as to decrease a failure of the distributing boards 4*a*, 4*b* due to moisture condensation.

The distributing board 4 constituted by an insulating plate may be called as an insulating base plate. Preferably, the distributing board 4 is made of a thermoset or thermoplastic synthetic resin to constitute the distributing board 4*a* and the distributing board 4*b*. The resin material is better in fomability and insulates various types of electrical components having the busbars 5*c* to 5*f*, the busbar bases 5*a*, the junction terminals 5*g*, 5*g*, the F—F terminals 5*h*. The synthetic resin also has a less moisture absorbing performance and is advantageous for dimensional stability, mass production, and a reliable electric performance.

In the present invention, electrically conductive materials are applied for the busbars 5 including the connector busbars 5*c*, 5*c*', the fuse busbars 5*d*, the relay busbars 5*e*, and the power supply busbar 5*f* and the junction terminals 5*g*, 5*g*', 5*h* including the F—F terminals 5*h*. Preferably, the conductive materials may be a metal sheet easily formed by press stamping or bending.

In consideration of a mass production and a low cost of the busbars applied for the present invention, busbars and terminals which are made of copper are preferably applied for the busbars 5c to 5f and the junction terminals 5g, 5h including the F—F terminals 5h in an example of the embodiment.

FIG. 4 is an enlarged perspective view showing an upper side of the wiring sheet 6 illustrated in FIG. 1. FIG. 5 is an enlarged perspective view showing an underside of the wiring sheet 6 disposed with electrical wires 9 such as the routing conductors 9. The perspective view of FIG. 5 is upside down as compared with FIGS. 1 to 4, FIG. 6, and FIG. 7.

The wiring sheet 6 is defined by a base plate 6a and a side plate 6b surrounding the base plate 6a. A through-hole portion 7c defining the alignment enhancing through-hole 7a is provided near the side plate 6b of the wiring sheet 6 so as to be integral with the base plate 6a at a predetermined position of the wiring sheet 6.

In a surrounding portion of the alignment enhancing through-hole 7a of FIG. 4, there is provided a compensation rib 7b to achieve a locally increased mechanical strength of the base plate 6a for inserting the connector busbars into the alignment enhancing through-holes 7a. The rib 7b also serves to locally support the distributing board.

The base plate 6a of the wiring sheet 6 of FIG. 4 is formed with a press-fit terminal insertion portions 6d each corresponding to each press-fit terminal mounted on the underside surface of the distributing board described above. Each press-fit terminal insertion portion 6d is formed with a compensating rib 6e at its surrounding area thereof so that the base plate 6a has a sufficient strength to receive the press-fit terminal in the press-fit terminal insertion portion 6d.

Furthermore, the base plate 6a of the wiring sheet 6 shown in FIGS. 4, and 5 is formed with a positioning hole 6c at two points thereof, thereby accurately combining the wiring sheet 6, the distributing board 4, the lower cover 10, and the upper cover 1 of FIG. 1.

That is, in order to accurately quickly combine the wiring sheet 6 of FIG. 4 with the distributing board 4 of FIG. 3, the two positioning holes 6c are provided in on the base plate 6a of the wiring sheet 6 of FIGS. 4 and 5. The insertion of a jig such as a precisely formed rod into the positioning hole 6c aligns the upper cover 1, the distributing board 4, the wiring sheet 6, and the lower cover 10 of FIG. 1 with each other, allowing an accurate, quick combining thereof.

Furthermore, as illustrated in FIG. 4, there is provided another positioning hole 6c' at several points thereof. Moreover, the side plate 6b of the wiring sheet 6 shown FIGS. 4 and 5 is provided with a positioning slit 6f, which accurately quickly combines the wiring sheet 6 of FIGS. 4 and 5 with the lower cover 10 of FIG. 6.

FIG. 5 showing a rear side of the wiring sheet 6 of FIG. 4 will be discussed in detail herein. In the base plate 6a there is provided the through-hole portion 7c having the alignment enhancing through-hole 7a. The base plate 6a is provided with several wire securing portions 6h for securing the routing conductors 9 with an adequate tension force thereof. Further, the base plate 6a is provided with many column projections 6i for turning the routing conductors. The wire securing portions 6h and the routing conductor turning projections 6i keep the routing conductors 9 in desired patterns with adequate tension forces.

Next, a step for arranging the routing conductors 9 on the wiring sheet 6 will be discussed. A single continues routing conductor 9 is arranged in a predetermined pattern on the wiring sheet 6 by an automatic machine while unintentional discontinuity of the continues routing conductor 9 is prevented. Then, the continuous routing conductors 9 arranged on the wiring sheet 6 is cut at predetermined points by a cutter. Thereby, the routing conductors 9 are arranged on the wiring sheet 6 of FIG. 5.

The electrical wires 9 of the routing conductors 9 will be discussed herein. The electrical wire 9 consists mainly of conductors and a covering insulation thereof. The electrical wire 9 can be bent in use and may be called as a core wire.

Preferably, the conductor is an electrically conductive metal wire which resists repeated flexing thereof. The conductor is, for example, a core wire consisting of a plurality of conductors which are bundled and appropriately twisted to have an adequate strength. The electrical wire 9 may be an enamel coated conductor having in a surface insulation performance.

The covering insulation protecting the conductors is preferably made of an insulating material which resists repeated bending thereof. Such a material is, for example, a synthetic resin, a soft resin, a rubber, and a compound thereof to compose the covering insulation of the electrical wire 9.

Next, a step for connecting the routing conductor 9 to the press-fit slit of the press-fit terminal through the press-fit blades of the press-fit terminal will be discussed. Initially, the press-fit blades receive the routing conductor 9 protected by the covering insulation. The tapered sharp-edge portions of the press-fit terminal cut the covering insulation including the enamel coat of the routing conductors 9, while the pair of press-fit blades are widened outward, and the press-fit slit is also slightly widened.

By a further insertion of the routing conductor 9, the press-fit slit positioned at the center of the press-fit terminal serves to further cut the covering insulation until the press-fit terminal contacts the conductors of the routing conductor 9. Thus, the press-fit terminal allows connection of the conductor simultaneously with stripping of the covering insulation of the routing conductor 9.

Thus, the U-shaped press-fit slit contacts the inside conductor of the routing conductor 9 to electrically connect thereto. That is, the insertion of the routing conductor 9 into the press-fit terminal allows electrical connection thereof.

When the distributing board 4 of FIG. 3 is mounted on an upper surface of the wiring sheet 6 of FIG. 4, the press-fit terminals extending downward from the distributing board 4 engage with the press-fit terminal insertion portions 6d disposed in an upper side of the wiring sheet 6. Thereby, the press-fit terminals are connected to the electrical wires arranged in a lower side of the wiring sheet 6, that is to the routing conductors 9 in straight and curved patterns as illustrated in FIG. 5.

A lot of the wire securing portions 6h illustrated in FIG. 5 each have a shape for receiving an associated one of the press-fit terminals. The press-fit terminal is inserted into the wire securing portion 6h, so that the press-fit terminal is electrically connected to one of the routing conductors 9 at the wire securing portion 6h.

As mentioned above, the press-fit terminals are mounted on the distributing board 4 of FIG. 3 to extend downward therefrom. The wire securing portion 6h corresponding to press-fit terminal insertion portion 6d is provided in the lower surface of the wiring sheet 6. As illustrated in FIG. 4, the press-fit terminal insertion portion 6d corresponding to the press-fit terminal is provided in the base plate 6a of the wiring sheet 6. As illustrated in FIG. 5, the routing conductors 9 are preliminary secured to the wire securing portions 6h. Thus, overlapping the distributing board 4 of FIG. 3 on the upper face, of the wiring sheet 6 of FIG. 4 fits the press-fit terminals to the routing conductors 9 at the wire securing portions 6h through the press-fit terminal insertion portions 6d. This allows a quick electrical connection thereof with ease.

As illustrated in FIG. 5, all over the base plate 6a of the wiring sheet 6, there are arranged the routing conductors 9 in the wiring area. That is, the wiring area extends all over the base plate 6a surrounded by the side plate 6b of the wiring sheet 6. The through-hole portion 7c and the alignment enhancing through-hole 7a are disposed in the wiring area of the wiring sheet 6.

Thus configured wiring sheet 6 allows an effective arrangement of the routing conductors 9, the through-hole portion 7c, the alignment enhancing through-hole 7a, and etc. thereon without any space restriction of the base plate 6a. Thus, the effective area usage of the base plate 6a of the wiring sheet 6 allows reduction in size and weight of the electrical junction box.

Figure 11:
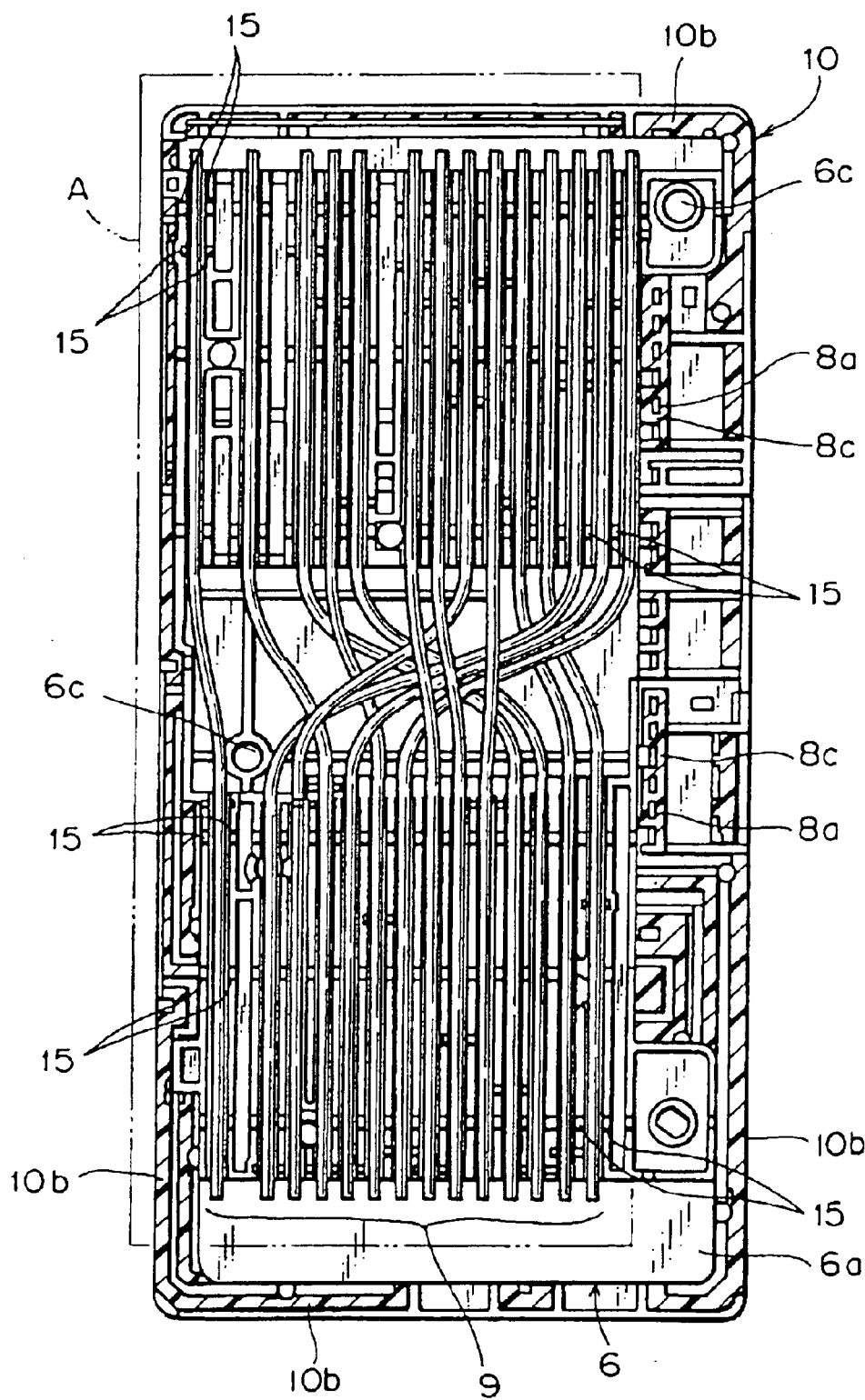
FIG. 11 is a bottom view showing a conventional wiring sheet attached to a distributing board, particularly showing a wiring area and its surrounding portion.

Referring again to FIG. 11, the conventional wiring sheet 6 is configured not to lie over the through-hole portion 8c and the alignment enhancing through-hole 8a of the lower cover 10. Therefore, the wiring sheet 6 has a reduced area, so that the wiring sheet 6 having a reduced wiring area A is applied to the electrical junction box.

As mentioned above, the conventional wiring sheet 6 maintains a desired wiring area A without overlapping with the through-hole portion 8c and the alignment enhancing through-hole 8a of the lower cover 10. Thus, the usage of such wiring sheet 6 is not suitable for reduction in size and weight of the electrical junction box.

However, as illustrated in FIG. 5, when the through-hole portion 7c and the alignment enhancing through-hole 7a are formed in the wiring area of the wiring sheet 6, the base plate.6a of the wiring sheet 6 is effectively used in area, thereby allowing minimization and weight reduction of the electrical junction box.

FIG. 6 is an enlarged perspective view showing the lower cover 10 of FIG. 1. The lower cover 10 has a bottom wall 10a and a sidewall 10b surrounding the bottom wall 10a. The bottom wall 10a is provided with the alignment enhancing through-hole 8a having a rib 8b and the through-hole portion 8c.

Figure 7:
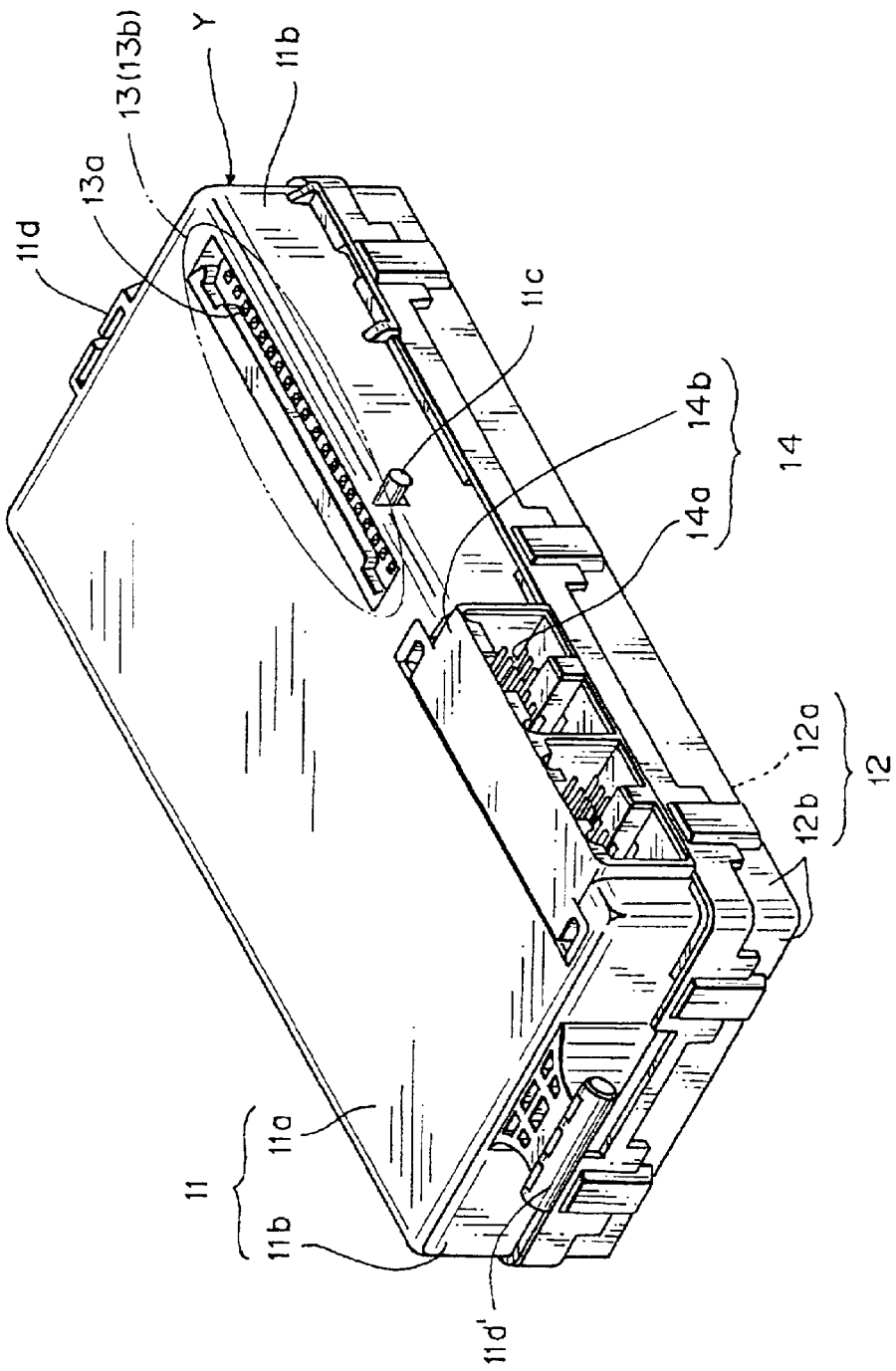
FIG. 7 is an enlarged perspective view showing a second electrical junction box of FIG. 1.

The sidewall 10b of the lower cover 10 of FIG. 6 is formed with two interlocking portions 10d, 10d' at opposed surfaces of the side wall 10b for interlocking the lower cover 10 with the second electrical junction box Y shown in FIG. 7. The interlocking portion 10d' is provided with a fitting hole 10d".

To accurately quickly align the lower cover 10 of FIG. 6 with the second electrical junction box Y of FIG. 7, there are provided two positioning extended pieces 10f positioned at longitudinal opposed positions of the lower cover 10 of FIG. 6.

Furthermore, the positioning-extended piece 10f has a positioning slit 10g for easy alignment of the lower cover 10 with the second electrical junction box Y. The side wall 10b of the lower cover 10 of FIG. 6 is formed with a connector housing receiving space 10i at a longitudinal portion thereof for receiving a connector housing 14b provided in the second electrical junction box Y of FIG. 7.

A plurality of the locking protrusions 10e are provided each on an upper portion of an end surface of the side wall 10b constituting the lower cover 10 of FIG. 6. The locking protrusions 10e engage with the engagement portions 1e of the upper cover 1 of FIG. 2 to interlock with each other.

The interlocking portion 10d' of the lower cover 10 of FIG. 6 has,two positioning projections 10h at an upper surface thereof. The positioning projections 10h serve to accurately quickly align the interlocking portion 10d' of the lower cover 10 with the fitting portion 1d of the upper cover 1 of FIG. 2.

Furthermore, the bottom wall 10a constituting the lower cover 10 of FIG. 6 is provided with a plurality of positioning holes 10c at desired positions thereof. The insertion of a jig such as a precisely formed rod into the positioning hole 10c accurately aligns the upper cover 1, the distributing board 4, the wiring sheet 6, and the lower cover 10 of FIG. 1. with each other. The jig is positioned substantially perpendicular to the bottom wall 10a of the lower cover 10 to combine the wiring sheet 6, the distributing board 4,and the upper cover of FIG. 1 with each other.

That is, initially the jig is inserted into the positioning hole 10c of the bottom wall 10a substantially perpendicular to the bottom wall 10a of the lower cover 10. As mentioned above, the positioning holes are also provided in the wiring sheet, the distributing board, and the upper cover at desired position thereof. The positioning jig rod is inserted into the positioning holes.

In such a way, the lower cover 10, the wiring sheet 6, the distributing board 4, and the upper cover 1 of FIG. 1 are sequentially combined to finally define the electrical junction box X. The positioning rod allows an accurate, quick assembling of the electrical junction box X with ease.

As illustrated in FIG. 6, on an upper surface of the bottom wall 10a of the lower cover 10, there are provided a plurality of ribs 10j, 10k extending longitudinally or perpendicular to the longitudinal direction. The ribs improve a structural strength of the bottom wall 10a to eliminate an undesirable deformation thereof.

FIG. 7 is an enlarged perspective view showing the second electrical junction box Y of FIG. 1. The second electrical junction box Y has mainly an upper cover 11 and a lower cover 12. The upper cover 11 is constituted by a top wall 11a and a side wall 11b surrounding the top wall 11a. The lower cover 12 is constituted by a bottom wall 12a and a side wall 12b surrounding the bottom wall 12a.

The top wall 11a of the upper cover 11 has a receptacle connector 13 unitarily defined with the top wall 11a. The receptacle connector 13 has a lot of female terminals 13a therein. Further, the upper cover 11 of the second electrical junction box Y has a male connector 14 having a connector housing 14b provided with male terminals 14a therein for electrical connection to another electrical circuit device.

On the side wall 11b of the upper cover 11 constituting the second electrical junction box Y of FIG. 7, there are provided lock portions 11d, 11d'. The lock portions 11d, 11d' are positioned at opposed sides to engage with the lower cover 10 of FIG. 6. The side wall 11b of the upper cover 11 of the second electrical junction box Y of FIG. 7 is provided with a positioning column projection 11c corresponding to the positioning slit log of the lower cover 10 of FIG. 6. This allows a smooth engagement of the second electrical junction box Y of FIG. 7 with the lower cover 10.

FIG. 8 is a longitudinal sectional view showing a state in which the connector busbar 5c attached to the distributing board 4 is inserted into the alignment enhancing through-hole 7a of the wiring sheet 6 and the connector busbar 5c is just before insertion into the alignment enhancing through-hole 8a of the lower cover 10.

The distributing board 4 is defined to put the distributing board 4a facing the upper cover over the distributing board 4b facing the wiring sheet 6. Each of the distributing board 4a and the distributing board 4b is constituted by each base plate 4d and each outer peripheral rib 4e surrounding the base plate 4d. Each distributing board 4a, or 4b is fitted with the busbar base 5a. As one example of the busbar 5 including the busbar base 5a, the terminal 5' of the connector busbar 5c extends downward from the distributing board 4 substantially perpendicular to the base plate 4d.

The through-hole portion 7c having the alignment enhancing through-hole 7a is provided in the base plate 6a of the wiring sheet 6. The through-hole portion 7c having the alignment enhancing through-hole 7a has a height equal to that of the side plate 6b. The distance between an upper end surface 7d and a lower end surface 7d' of the through-hole portion. 7c is determined to be equal to the distance between an upper end surface 6g and a lower end surface 6g' of the side plate 6b.

The wiring sheet 6 is formed with the through-hole portion 7c, the rib 7b, an insertion opening 7f of the terminal 5' of the busbar 5, an exit opening 7g, the tapered portion 7e extending downward from the insertion opening 7f to the exit opening 7g to define a progressively decreasing sectional area, the end surface 7d provided around the insertion opening 7f, and the end surface 7d' around the exit opening 7g, thereby defining the alignment enhancing through-hole 7a.

Through the alignment enhancing through-hole 7a, the connector busbar 5c is downwardly inserted with a little clearance therebetween. Then, the connector busbar 5c is inserted into the alignment enhancing through-hole 8a of the lower cover 10 also with a little clearance therebetween, so that the connector busbar 5c is received in the connector housing 8 in a desired position to define the male connector.

As well as the alignment enhancing through-hole 7a of the wiring sheet 6, the alignment enhancing through-hole 8a of the lower cover 10 has the tapered portion Be extending downward from the insertion opening. 8f to the exit opening 8g to define a progressively decreasing sectional area. Each exit openings 7g or 8g has a width 7h or 8h which is determined to be substantially equal to the thickness 5i of the terminal 5' of the busbar 5.

This configuration guides smoothly the connector busbar 5c attached to the distributing board 4 into the alignment enhancing through-holes 7a, 8a. Furthermore, the connector busbar 5c can be assembled in the lower cover 10 through the wiring sheet 6 with a smaller assembling tolerance to define the male connector.

Referring to more details, for smooth insertion of an inaccurately positioned busbar 5 on the distributing board into the alignment enhancing through-holes 7a, 8a, each insertion openings, 7f or 8f of the alignment enhancing through-holes 7a or 8a needs to have a larger width.

However, the widths 7h, 8h of the exit openings 7g, 8g are substantially equal to the thickness 5i of the terminal 5' of the busbar 5 to accurately position the busbar within the alignment enhancing through-holes 7a, 8a.

The tapered portions 7e, 8e are provided so that the terminal 5' of the busbar 5 is smoothly inserted into the alignment enhancing through-hole 7a of the wiring sheet 6 and the alignment enhancing through-hole 8a of the lower cover 10 through the insertion openings 7f, 8f and the exit openings 7g 8g.

In addition, the terminal 5' of the busbar 5 has a busbar tab 5b having a progressively reducing thickness at a leading end thereof. Thus, the terminal 5' of the busbar 5 is easily inserted into the alignment enhancing through-hole 7a of the wiring sheet 6 and the alignment enhancing through-hole 8a of the lower cover 10.

The widths 7h, 8h of the exit opening 7g 8g corresponding to the thickness 5i of the terminal 5' of the busbar 5 will be discussed in detail herein. For example, the clearance between the terminal 5' of the busbar 5 and each exit opening 7g or 8g is determined to be about 1/50 to 1/5 of the thickness 5i of the terminal 5' of the busbar 5.

A clearance smaller than 1/50 of the thickness 5i of the terminal 5' of the busbar 5 would not allow a practical dimension tolerance of the widths 7h, 8h of the exit openings 7g 8g in a molding step of the wiring sheet 6 and the lower cover 10. Therefore, it may happen that the terminal 5' of the busbar can not pass smoothly through the exit opening 7g 8g.

Meanwhile, a clearance larger than 1/5 of the thickness 5i of the terminal 5' of the busbar 5 would not accurately position the terminal 5' of the busbar 5 within the alignment enhancing through-hole 7a of the wiring sheet 6 and the alignment enhancing through-hole 8a of the lower cover 10. Accordingly, it may be difficult to quickly accurately combine the distributing board 4 fitted with the busbars 5, the wiring sheet 6, and the lower cover 10 with each other.

As illustrated in FIG. 8, a vertical distance 8i of the alignment enhancing through-hole 8a formed in the lower cover 10 is determined to be approximately equal to a thickness 10m of the bottom wall 1a of the lower cover 10.

In FIG. 8, the vertical distance 8i of the alignment enhancing through-hole 8a is the sum of the thickness 10m of the bottom wall 10a of the lower cover 10 and a height of the rib 8b provided, on an upper surface of the bottom wall 10a around the alignment enhancing through-hole 8a. The height of the rib 8b is determined to be equal to heights of the ribs 10j, 10k formed on an upper surface of the lower cover 10 shown in FIGS. 6, 8.

Such configuration allows minimization of the through-hole and its associated surrounding portion of the lower cover as well as an accurate positioning of the busbar terminal 5'. This reduces the lower cover 10 in size, enabling minimization of molding dies of the lower cover 10 together with a cost reduction of the molding dies.

According to the present invention, the alignment enhancing through-hole 7a is provided in the wiring sheet 6 for insertion of the terminal 5' of the busbar 5 attached to the distributing board 4. This allows a smaller assembling tolerance when the terminal 5' of the busbar 5 is received in the alignment enhancing through-hole 8a of the lower cover 10.

Accordingly, an undesirable offset of the busbar tab 5b will be smaller in combination of the lower cover 10 with the distributing board 4 and the wiring sheet 6. This also allows a smaller assembling tolerance in combination of the lower cover 10 with the unit of the distributing board 4 and the wiring sheet 6. Additionally, it can be achieved to minimize the alignment enhancing through-hole 8a of the lower cover 10 and its associated surrounding portion.

As illustrated in FIG. 8, the connector housing 8 associated with the alignment enhancing through-hole 8a of the lower cover 10 is provided in the lower cover 10 at a lower portion thereof. The connector housing 8 and the terminals 5' of the busbars 5' define the male connector which is coupled to an associated receptacle connector for electrical connection thereof.

In FIG. 8, the male connector can be coupled to the receptacle connector 13 provided in the top wall 11a of the upper cover 11 of the second electrical junction box Y shown in FIG. 7. The receptacle connector 13 has female terminals 13a and a connector housing 13b unitarily formed with the top wall 11a of the upper cover 11. Thus, as illustrated in FIG. 1, the electrical junction box X according to the present invention can be connected to another electrical connection component like the second electrical junction box Y.

Next, a sequential assembling process of the electrical junction boxes X, Y, Z will be discussed. The distributing board 4 of FIG. 3 is downwardly mounted on the wiring sheet 6 of FIG. 4. The combined unit of the distributing board 4 and the wiring sheet 6 is mounted on the lower cover 10 of FIG. 6. Then, the upper cover 1 of FIG. 2 is mounted to define the electrical junction box X. The electrical junction box X is mounted on an upper surface of the second electrical junction box Y shown in FIG. 7 to complete the electrical junction box Z.

However, another sequential assembling process of the electrical junction boxes X, Y, Z may be possible. For example, the electrical junction box Z may be assembled by the components of FIGS. 7, 6, 4, 3, and 2 sequentially upward.

What is claimed is:

1. An electrical junction box comprising an upper cover, a distributing board provided with a busbar, a wiring sheet, and a lower cover formed with a through-hole for receiving a terminal of the busbar, wherein the wiring sheet is formed with a through-hole for receiving the terminal of the busbar, the through-hole of the lower cover and the through-hole of the wiring sheet each having a progressively decreasing sectional area, and the terminal of the busbar is inserted into the through-hole of the wiring sheet and further into the through-hole of the lower cover when the lower cover is combined with the wiring sheet which is combined with the distributing board.

2. The electrical junction box recited in claim 1, wherein the through-hole formed in the wiring sheet has an insertion opening, an exit opening, and a tapered portion such that the through-hole has a sectional area progressively smaller from the insertion opening to the exit opening, and the exit opening has a width substantially equal to a thickness of the terminal of the busbar.

3. The electrical junction box recited in claim 1, wherein the through-hole of the lower cover has an extending length substantially equal to a bottom wall thickness of the lower cover.

4. The electrical junction box recited in any one of claims 1 to 3, wherein a connector housing is positioned under the lower cover, the connector housing being associated with the through-hole of the lower cover.

5. The electrical junction box recited in claim 1, wherein the through-hole of the wiring sheet is positioned in a wiring area of the wiring sheet.

6. The electrical junction box recited in claim 1, wherein the through-hole formed in the lower cover has an insertion opening, an exit opening, and a tapered portion such that the through-hole has a sectional area progressively smaller from the insertion opening to the exit opening.

7. The electrical junction box recited in claim 1, wherein the through-hole formed in the lower cover has an exit opening such that the busbar can pass through the exit opening with a clearance equal to 1/50 to 1/5 of a thickness of the busbar therebetween.

8. The electrical junction box recited in claim 1, wherein the wiring sheet has a base plate in which the through-hole of the wiring sheet is formed.

9. The electrical junction box recited in claim 8, wherein the base plate is compensated by a surrounding rib.

10. The electrical junction box recited in claim 8, wherein arranged all over an underside of the base plate.

* * * * *